United States Patent [19]

Carickhoff et al.

[11] Patent Number: 4,694,259

[45] Date of Patent: Sep. 15, 1987

[54] DATA TRACKING CLOCK RECOVERY SYSTEM HAVING MEDIA SPEED VARIATION COMPENSATION

[75] Inventors: Richard C. Carickhoff, Lansdale; Hakan O. Hemdal, West Chester; Alvin L. Schultz, East Greenville, all of Pa.

[73] Assignee: Laser Magnetic Storage International Company, Colorado Springs, Colo.

[21] Appl. No.: 912,879

[22] Filed: Sep. 29, 1986

[51] Int. Cl.$^4$ ............................................. H03L 7/08
[52] U.S. Cl. ...................................... 331/1 A; 331/10; 331/17; 331/23; 331/25; 375/120
[58] Field of Search ..................... 331/1 A, 10, 17, 23, 331/25; 375/120

[56] References Cited

U.S. PATENT DOCUMENTS

| | | | |
|---|---|---|---|
| 4,144,489 | 3/1979 | Ward et al. | 331/1 A X |
| 4,380,742 | 4/1983 | Hart | 331/1 A |
| 4,456,890 | 6/1984 | Carickhoff | 331/1 A |

Primary Examiner—Siegfried H. Grimm
Attorney, Agent, or Firm—Weiser & Stapler

[57] ABSTRACT

A clock recovery and data separator system of the type described in U.S. Pat. No. 4,456,890 is improved by the inclusion of a detector for detecting the trend of instantaneous media speed variation (ISV). The system includes a phase locked loop in which the ISV trend detector is placed between the output of the phase detector and the input of an up/down counter whose output is passed through a digital to analog converter to control the VCO. The ISV trend detector provides a signal which partially compensates phase shift, thereby permitting rapid data recovery performance.

5 Claims, 2 Drawing Figures

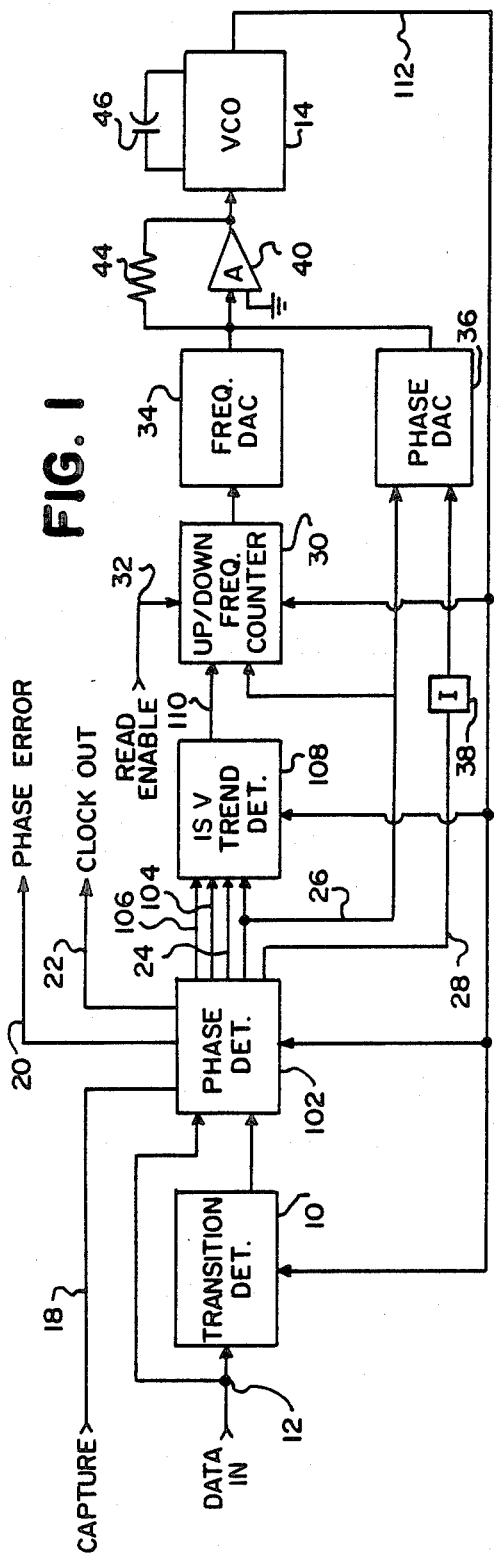
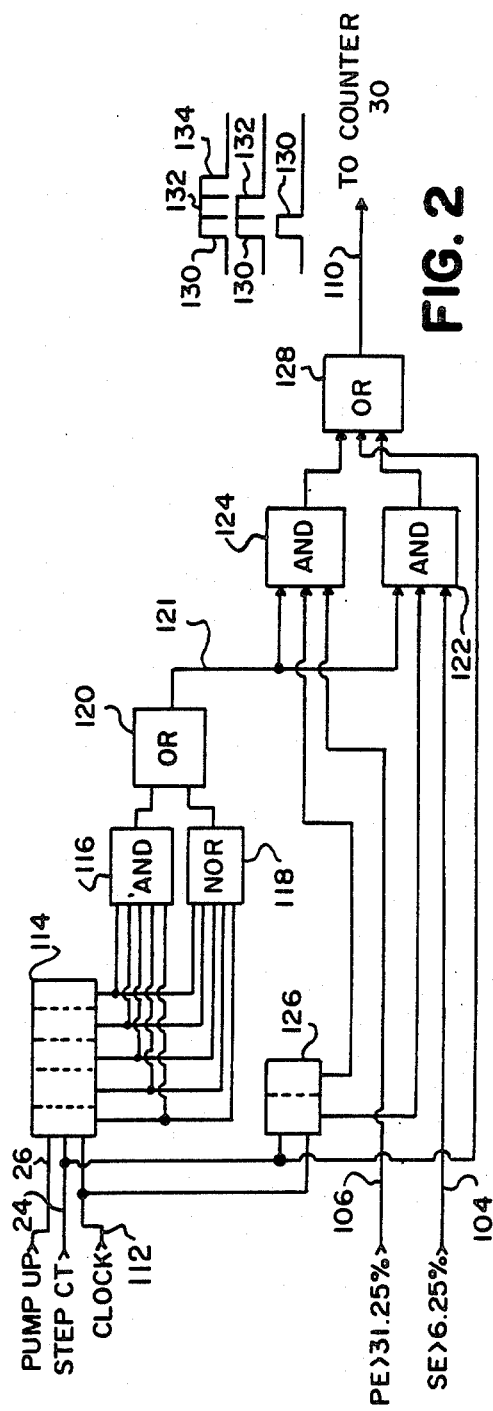

DATA TRACKING CLOCK RECOVERY SYSTEM HAVING MEDIA SPEED VARIATION COMPENSATION

This invention relates to a clock recovery system, and particularly a data tracking clock recovery system utilizing digitally controlled oscillators for clock and data separation of the type described in U.S. Pat. No. 4,456,890.

U.S. Pat. No. 4,456,890, granted June 26, 1984 to R. C. Carickhoff describes a clock recovery and data separator system which is relatively stable against drift and temperature changes, achieved synchronization with minimum phase jitter and did not require high frequency oscillators to obtain frequency synchronization. However, the system described in the aforementioned patent is not altogether stable for phase noise caused by instantaneous media speed variations (ISV).

Accordingly, it is the object of the present invention to provide an improved clock recovery and data separator system of the type described in U.S. Pat. No. 4,456,890 having greater tolerance to phase noise and ISV.

In accordance with the present invention, the system described in U.S. Pat. No. 4,456,890 is modified by the inclusion of an ISV trend detector which drives an up/down frequency counter whose output drives a digital-to-analog converter.

One feature of the present invention resides in the fact that the ISV trend detector provides a signal which partially compensates phase shift thereby permitting rapid data recovery performance.

The above and other features of this invention will be more fully understood from the following detailed description and the accompanying drawing, in which:

FIG. 1 is a block circuit diagram of a clock recovery and data separator system in accordance with the presently preferred embodiment of the present invention; and FIG. 2 is a block circuit diagram of an ISV trend detector for use in the apparatus shown in FIG. 1.

Referring to the drawings, there is illustrated a block circuit diagram of a data separator and clock recovery system in accordance with the presently preferred embodiment of the present invention. The system is an improvement of the clock recovery and data separator system described in U.S. Pat. No. 4,456,890 which is incorporated herein by reference. For ease of explanation, reference numerals less than 100 shown in the accompanying drawing correspond to those in the drawings of the aforementioned U.S. Pat. No. 4,456,890. Thus, as described in the aforementioned patent, transition detector 10 has a first input 12 for receiving input data encoded on a moving media and a second input receiving clock signals from the output 112 of voltage controlled oscillator (VCO) 14. Transition detector 10 provides an output to phase detector 102 which also receives a second input directly from input 12. Phase detector 102 also receives an input from VCO 14 and a capture signal via lead 18. Phase detector 102 provides a phase error output via lead 20, a clock output via lead 22, a step count output via lead 24, a pump up signal via lead 26, a pump enable signal via lead 28 and phase error gate signals via leads 104 and 106. Up/down frequency counter 30 receives the pump up signals from phase detector 102 as well as clock signals from VCO 14, and a read/enable signal via lead 32. Counter 30 provides an input directly to frequency digital-to-analog converter 34. Phase digital-to-analog converter 36 receives a pump-up signal input from lead 26 and an inverted pump enable signal from lead 28 (inverted by inverter 38). The outputs of converters 34 and 36 are provided as analog inputs to amplifier 40 whose output is provided directly to VCO 14. The gain of amplifier 40 is adjusted by resistor 44, and the nominal frequency of VCO 14 is controlled by capacitor 46.

The present invention contemplates the addition of ISV trend detector 108 which receives pump enable and pump-up signals via leads 24 and 26 and phase error gate signals via leads 104 and 106 from phase detector 102. ISV trend detector 108 provides a step count signal via lead 110 to up/down frequency counter 30. Frequency converter 34 provides an output signal representative of the count contained in frequency counter 30.

As described in U.S. Pat. No. 4,456,890, oscillator 14 operates at a frequency sixteen times that of the recovered clock signal. Phase detector 102 includes a register which, among other things, provides a divide by 16 function on the signal from oscillator 14 to provide the recovered clock. Thus, the data cell is divided into 16 steps, each representing 6.25 percent of the cell. The pump-up and pump-down signals to the up/down frequency counter 30 are determined by the portion of the cell in which the data transition occurs.

Phase detector 102 is nearly identical to the phase detector 16 described in U.S. Pat. No. 4,456,890 and includes a PROM and register arranged to provide the phase error signal on lead 20, step count signal on lead 24, clock out signal on lead 22, pump up signal on lead 26 and pump enable signal on lead 28, all as described in conjunction with FIG. 2 of U.S. Pat. No. 4,456,890. The principal difference between phase detector 102 of the present apparatus and phase detector 16 described in U.S. Pat. No. 4,456,890 resides in the provision of output leads 104 and 106. As described in U.S. Pat. No. 4,456,890, lead 20 provides a digital output representative of the instantaneous phase error. According to the present invention, the PROM of phase detector 102 also provides a gate signal on lead 104 whenever the phase error exceeds 6.25 percent (two "counts" or more) and provides a gate signal on lead 106 whenever the phase error exceeds 31.75 percent (six "counts" or more).

FIG. 2 illustrates the ISV trend detector 108 according to the present invention. Detector 108 includes a 5-bit parallel output shift register 114 which provides outputs from each bit position to AND gate 116 and NOR gate 118. Gates 116 and 118 provide outputs to OR gate 120 which provides an accelerate gate signal on lead 121 to one input of AND gates 122 and 124. Register 114 receives the step count signal and pump up signal via leads 24 and 26 from phase detector 102 and the clock signal from VCO 14 via lead 112. The clock signal and step count signal are also provided to 2-bit parallel output shift register 126, whose first bit output is provided as a second input to AND gate 122 and whose second bit output is provided as a second input to AND gate 124. The 6.25+% phase error gate signal on lead 104 provides a third input to AND gate 122, and the 31.25+% phase error gate signal on lead 106 provides a third input to AND gate 124. OR gate 128 receives inputs from the step count on lead 24, AND gate 122 and AND gate 124 to provide a count signal to frequency counter 30 via lead 110.

Shift register 114 will input a binary "1" with each step count signal on lead 24 gated by a high pump up signal on lead 26 (although actual loading and shift of the contents of register 114 is triggered by the clock signal from VCO 14). Likewise, a binary "0" will be loaded with each step count signal when the pump up signal is low. (As explained in U.S. Pat. No. 4,456,890, the pump up signal will be set high when the clock lags the data—to thereby speed up the clock, whereas the pump up signal will be set low when the clock leads the data—thereby slowing down the clock.)

In operation of ISV trend detector 108, upon receipt of a step count signal to adjust the count in counter 30 (which count is increased if the pump up signal is high or decreased if the pump up signal is low), the step count signal operates OR gate 128 to provide a pulse 130 to counter 30 on lead 110 to alter the count therein. The step count pulse also sets the value of the first bit position of register 114, the value being "1" or "0" based on whether the pump up signal is high or low. When the next step count signal arrives at register 114, it is also clocked in, shifting the previously recorded bit one position. If register 114 becomes completely filled with either ones or zeros (indicating five successive data cycles of lagging or leading clock pulses on lead 22), one or the other of AND gate 116 and NOR gate 118 operate to provide an accelerate gate signal on lead 121 from OR gate 120. Thus, if register 114 contains all ones (indicative that the clock 22 lags the data for five data cycles), gate 116 operates to pass the accelerate gate signal through OR gate 120. On the other hand, if register 114 contains all zeros, gate 118 will operate to generate the accelerate gate signal.

Shift register 126 shifts the step count pulse signal on lead 24 with each VCO clock pulse going negative on lead 112. As heretofore explained, the VCO clock rate on lead 112 is sixteen times as great as the output clock rate on lead 22. Since a step count pulse usually occurs each output clock period (defined by the pulses on lead 22), as explained in U.S. Pat. No. 4,456,890, each step count pulse will be stepped through 2-bit shift register 126 before the appearance of the next step count pulse. (This is different from 5-bit shift register 114 which steps with each step count pulse. Thus, shift register 114 will step successive step count pulses whereas shift register 126 will step one step count pulse.)

A step count pulse usually has a duration equal to the VCO clock period on lead 112 (one-sixteenth of a clock period on lead 22). (An exception is accelerated synchronization described in conjunction with FIGS. 6 and 7 of U.S. Pat. No. 4,456,890.) Therefore, if a step count pulse occurs on lead 24 during a first clock pulse on lead 112, register 126 steps that pulse to provide a high output to AND gate 122 when that first clock pulse on lead 112 goes low and further steps that pulse to provide a high output to AND gate 124 when the next (second) clock pulse on lead 112 goes low.

If the phase error detected by detector 102 is greater than 6.25%, the gate signal on lead 104 will be high; if the phase error is greater than 31.25%, the gate signals on both leads 104 and 106 will be high. Thus, with a phase error of more than 31.25% and both phase error gate signals high and register 114 filled with all ones or zeros (indicating five cycles of lagging or leading clock pulses), the step count pulse on lead 24 will be passed by OR gate 128 for one VCO clock period (pulse 130), the shifted step count pulse from the first output of register 126 will be passed by AND gate 122 and OR gate 128 for a second period (pulse 132), and the shifted step count pulse from the second output of register 126 will be passed by AND gate 124 and OR gate 128 for a third period (pulse 134). Therefore, additional counts are added to or subtracted from the count in up/down frequency counter 30 to more rapidly adjust the frequency of VCO 14.

Although the present invention is described in conjunction with a 5-bit register 114, it is evident that the register may be any size. The criteria in determining the size of register 114 is that it should not be so small as to react to temporary frequency shifts of short duration (i.e., less than three output clock cycles) yet should not be so large as to not quickly react to frequency changes. A 5-bit register size is deemed optimum. Also, although the invention has been described as reacting to 6.25% and 31.25% phase errors, it is evident that any phase error gate levels can be selected, and that even greater count shifts can accommodate a wide range of phase error gate levels. Thus, by increasing the size of register 126 and adding more AND gates like gates 122 and 124, any number of gate levels can generate a corresponding number of count change for counter 30.

This invention is not to be limited by the embodiment shown in the drawings and described in the description, which is given by way of example and not of limitation, but only in accordance with the scope of the appended claims.

What is claimed is:

1. In a clock recovery system for generating an output clock signal locked to the phase and frequency of an input data rate, said input data rate comprising a sequence of data signals, said system comprising data detection means for detecting said data signals, oscillator means responsive to an analog signal for generating a first clock signal having a frequency representative of the value of said analog signal, phase detector means responsive to said first clock signal for cyclicly counting the oscillations of the first clock signal to generate said output clock signal and being responsive to the count of oscillations and to the output of said data detection means to determine the relative phase relationship between each data signal and the output clock signal, counter means responsive to said phase detector means for containing a count representative of the frequency of said first clock signal and being responsive to the phase relationship determined by said phase detector means to selectively increment or decrement the count therein, and converter means responsive to the count in the counter means to generate said analog signal which drives the oscillator means, the improvement comprising: a media speed variation detector means responsive to said phase detector means for accelerating the change in count in said counter means.

2. Apparatus according to claim 1 wherein said media speed variation detector means comprises control means responsive to said phase detector means for generating an accelerate gate signal when said phase detector means has detected a predetermined phase relationship, and logic means responsive to said accelerate gate signal and to a predetermined phase error gate signal generated by said phase detector means for generating a predetermined number of pulses to increment or decrement the count in said counter means.

3. Apparatus, according to claim 2 wherein said control means comprises a shift register responsive to said phase detector means and gate means responsive to said shift register for providing said accelerate gate signal when said phase detector means detects a preselected number of successive data signals leading or lagging in phase relation to the corresponding output clock signal.

4. Apparatus according to claim 3 wherein said logic means comprises a second shift register having a plurality of stages, a plurality of AND gate means each having a first input connected to said first-named shift register to receive said accelerate gate signal, a second input connected to respective ones of said stages of said second shift register and a third input connected to said phase detector means to receive a respective phase error gate signal, and OR gate means having its inputs connected to said phase detector means and to each of said AND gate means and having its output connected to said counter means.

5. Apparatus according to claim 2 wherein said logic means comprises a shift register having a plurality of stages, a plurality of AND gate means each having a first input connected to said control means to receive said accelerate gate signal, a second input connected to respective ones of said stages of said shift register and a third input connected to said phase detector means to receive a respective phase error gate signal, and OR gate means having its inputs connected to said phase detector means and to each of said AND gate means and having its output connected to said counter means.

* * * * *
* * * * *